(12) United States Patent
Marbot

(10) Patent No.: US 6,169,436 B1
(45) Date of Patent: Jan. 2, 2001

(54) VARIABLE DELAY CIRCUIT

(75) Inventor: Roland Marbot, Sassenage (FR)

(73) Assignee: STMicroelectronics S.A., Gentilly (FR)

( * ) Notice: Under 35 U.S.C. 154(b), the term of this patent shall be extended for 0 days.

(21) Appl. No.: 09/146,602

(22) Filed: Sep. 3, 1998

(30) Foreign Application Priority Data

Sep. 4, 1997 (FR) .................................................. 97 11022

(51) Int. Cl.$^7$ .................................................. H03H 11/26
(52) U.S. Cl. .......................................... 327/270; 327/269
(58) Field of Search .................................... 327/269, 270, 327/271, 272, 276, 277, 278, 288

(56) References Cited

U.S. PATENT DOCUMENTS 5,327,031  7/1994  Marbot et al. .

FOREIGN PATENT DOCUMENTS 0 317 758A2  5/1989  (EP) .
0 606 979A2  7/1994  (EP) .

Primary Examiner—Kenneth B. Wells
Assistant Examiner—Linh Nguyen
(74) Attorney, Agent, or Firm—Theodore E. Galanthay; Stephen C. Bongini; Fleit, Kain, Gibbons, Gutman & Bongini P.L.

(57) ABSTRACT

A delay circuit includes a primary circuit receiving an input signal and outputting two intermediate signals having a delay therebetween. A combination circuit with two modules that output a combination signal on the basis of the addition with weighting and effect of integration of the intermediate signals and of their conjugate. Each module includes a discharging circuit and a charging circuit, which each have switching elements controlling the connection between a common line and first and second supply potentials. These connections use a variable resistor and a non-variable resistor so as to ensure the permanent participation of the two modules in the charging or discharging of a capacitor. This delay circuit is particularly useful in CMOS circuits.

20 Claims, 10 Drawing Sheets

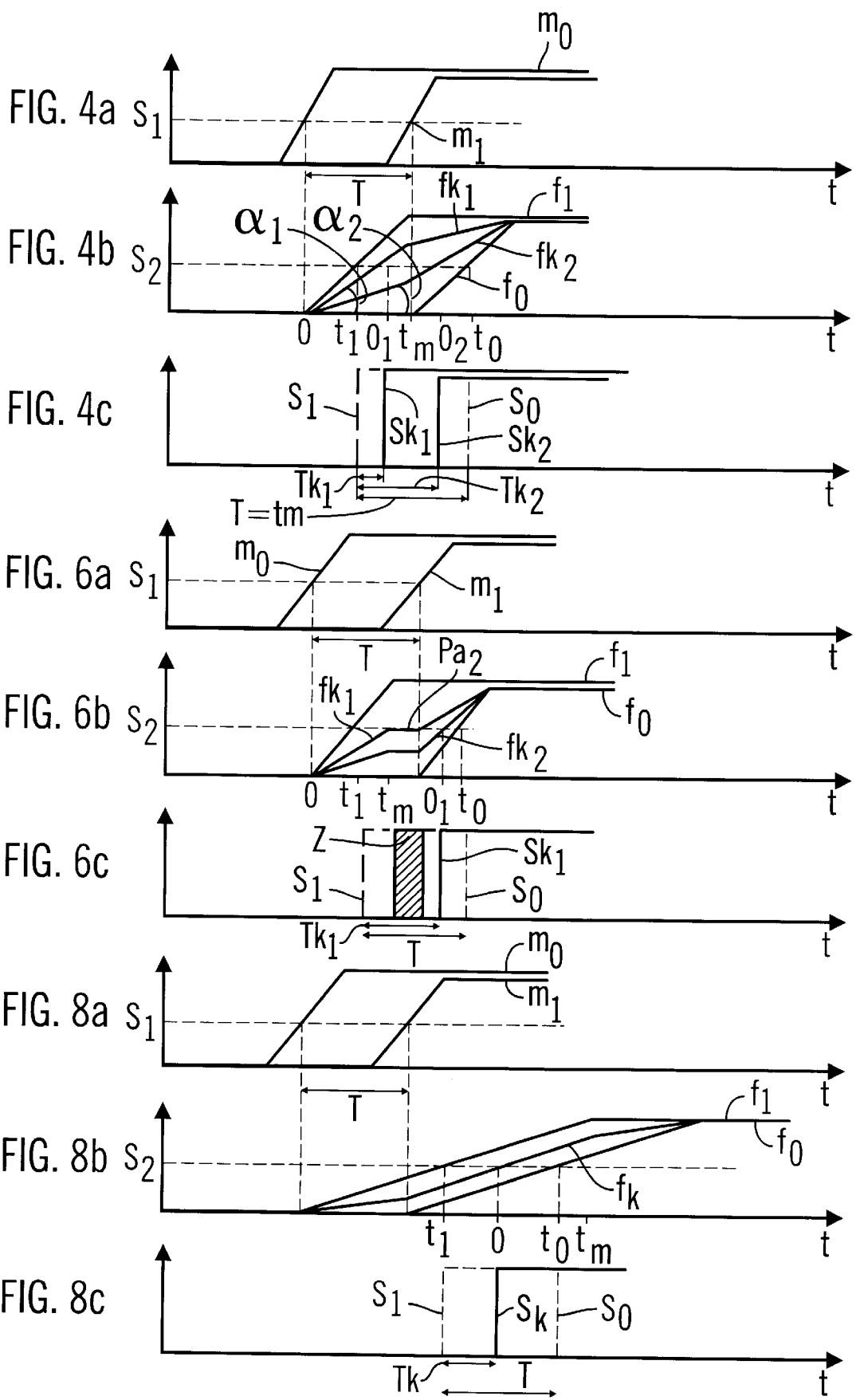

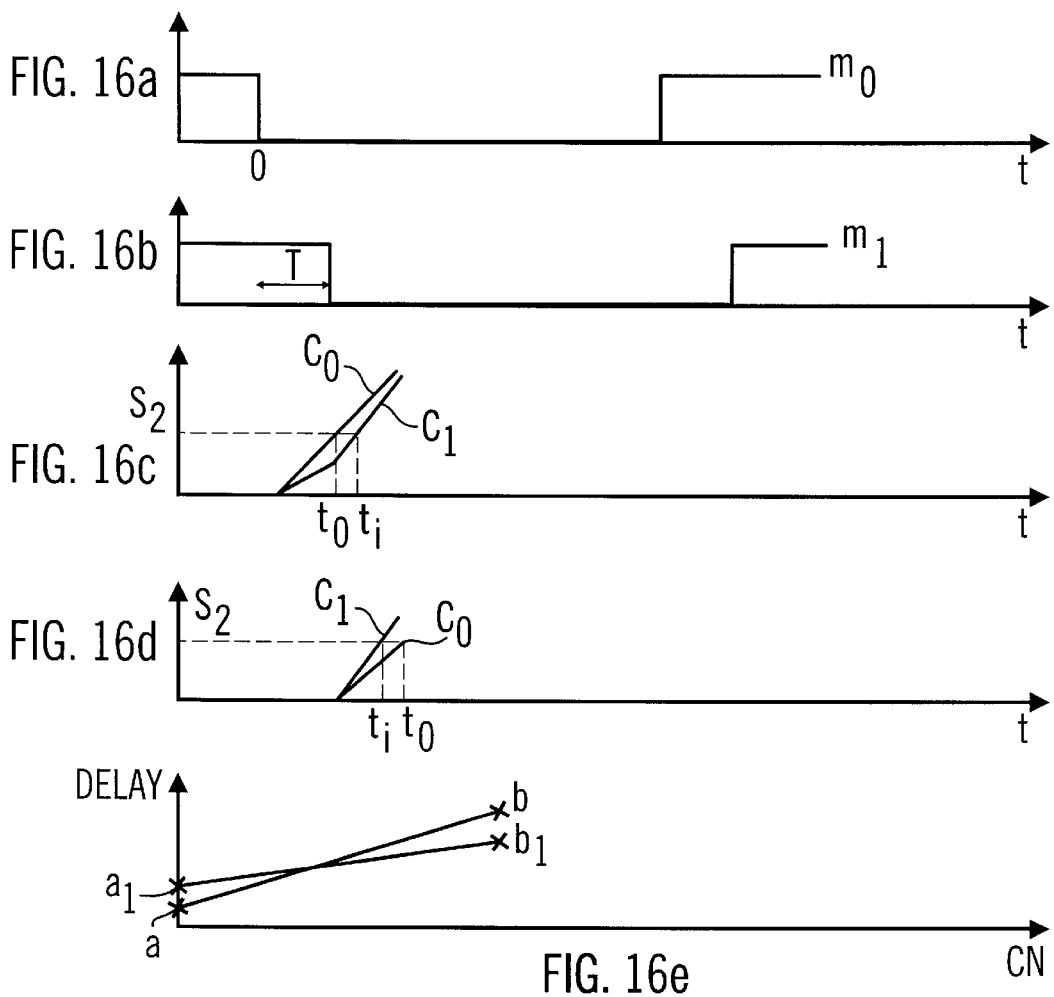
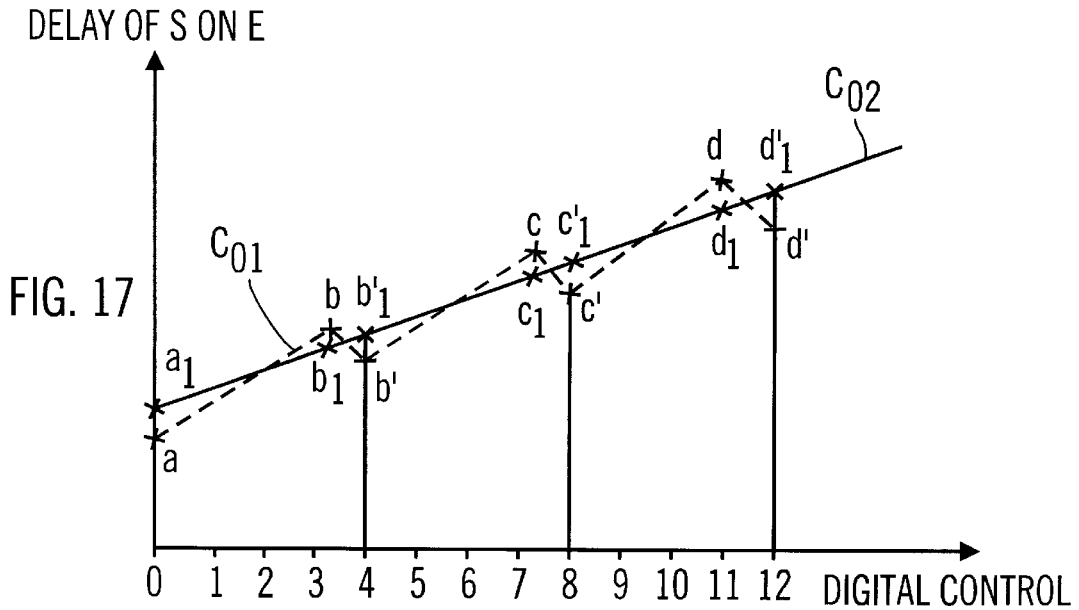

VARIABLE DELAY CIRCUIT

CROSS-REFERENCE TO RELATED APPLICATIONS

This application is based upon and claims the benefit of priority of the prior French Patent Application No. 97-11022, filed Sep. 4, 1997, the entire disclosure of which is herein incorporated by reference.

BACKGROUND OF THE INVENTION

1. Field of the Invention

The present invention relates to variable delay circuits, and more specifically to variable delay circuits whose delay can be adjusted as a function of a delay instruction, which can take the form of a numerical variable.

2. Description of Related Art

The applications of variable delay circuits are numerous. For example, delay circuits are used for phase adjustments between two logic signals. In particular, one signal is supplied to the input of a delay circuit and the delay of the delay circuit is then adjusted using the measurement of the phase shift between the two logic signals. A phase locked loop circuit is controlled on the basis of an analog or digital setting signal. The digital approach is generally preferred because it is less sensitive to disturbances and to attenuation due to signal transmission. Furthermore, in integrated circuit form, the digital approach is less sensitive to manufacturing variations.

A first conventional digitally-controlled delay circuit uses a set of elementary gates such as inverters. All of the gates are associated with a digitally-controlled interconnection system that enables a cascade connection of a variable number of the elementary gates. This type of circuit is limited to applications in which it is not necessary to obtain greater precision in setting the delay than the intrinsic delay of an elementary gate.

Another conventional delay circuit uses a resistor/capacitor-type circuit in which the resistor consists of several elementary resistors that are connected together in parallel as a function of the digital command. The delay is fixed by the time constant of the circuit so if all of the elementary resistors have the same value, the delay is inversely proportional to the number of resistors selected. To obtain a delay precision that is constant throughout the setting range, it is necessary for the function linking the delay to the numerical setting variable to approach a linear function. However, the response obtained by the resistor/capacitor-type circuit is far from such a linear relationship, and is actually of a hyperbolic type. To approach the linear response, it is necessary to size the elementary resistors at values that are quite precise and different from one another. However, such exact circuit elements are very difficult to obtain in integrated circuit form. Furthermore, it is necessary to provide such a circuit for each signal whose phase is to be adjusted.

If the delay circuit is to be used in a phase locked loop circuit of the type described in European Patent Application (published) No. 0 441 684, filed Jan. 30, 1991, for "Circuit verrouillé en phase et multiplieur de frequence en resultant" (Phase Locked Circuit and Frequency Multiplier Resulting Therefrom), the above approach is not satisfactory because of the required size and the sensitivity to manufacturing variations. While the variable delay circuit of French Patent No. 2 690 022, for "Circuit à retard variable" (Variable Delay Circuit) provides a linear response for the delay as a function of the delay instruction, the amplitude of the delay range is not technologically satisfactory. To overcome this problem, the circuit of French Patent No. 2 689 339, for "Procédé et dispositif de reglage de retard à plusieurs gammes" (Method and Device for the Setting of Delay with Several Ranges) employs the concept of multiple ranges. However, in practice, problems of linearity of the delay as a function of the delay instruction are encountered.

SUMMARY OF THE INVENTION

In view of these drawbacks, it is an object of the present invention to remove the above-mentioned drawbacks and to provide a delay circuit that enables a precise delay setting and at the same time ensures, with sufficient approximation, a linear response of the delay as a function of the delay instruction during a substantial time interval in order to approach a constant setting precision.

Another object of the present invention is to provide a delay circuit having an output signal that is delayed with respect to an input signal, with the delay being adjustable as a function of a delay instruction. The delay circuit has a primary circuit, a combination circuit, and a shaping circuit. The primary circuit receives the input signal and generates two intermediate signals having a fixed delay therebetween. The combination circuit has a control input that receives a control variable representing the delay instruction, and two signal inputs that receive the intermediate signals. The combination circuit outputs a combination signal that results from a superimposition, with a weighting and integration effect, of the intermediate signals. In a preferred embodiment, each of the input signals is weighted by a weighting coefficient, with the values of the weighting coefficients being a function of the control variable.

The combination signal from the combination circuit is input to the shaping circuit. The shaping circuit, which has a threshold effect, produces an activation signal when the combination signal (by integration effect) reaches a specified threshold. Thus, the effective delay of the output signal with respect to the input signal depends on the level of the combination signal. It is desirable that the maximum and minimum amplitudes of the combination signal should be independent of the delay instruction, so the sum of the two weighting coefficients is constant. In the preferred embodiment, the integration is produced by an integrator or a time constant circuit that has a saturation effect defining the extreme levels of the combination signal.

During operation, the transition time is defined as the interval during which the combination signal varies according to a linear or quasi-linear function when one of the weighting coefficients associated with the intermediate signals is zero. By dictating a fixed delay smaller than the transition time, the delay of the output signal with respect to the input signal does not have any discontinuity as a function of the weighting coefficients. In order for the delay variation (as a function of the delay instruction) to vary throughout the setting range according to a substantially linear function of the instructed value, the combination circuit and/or the primary circuit can be sized so that the fixed delay will be equal to half of the transition time.

This constraint linking the fixed delay and the transition time prevents the widening of the amplitude of the delay range in the circuit of French Patent No. 2 690 022 (see above). The delay range is defined by the fixed delay circuit. If this fixed delay is increased, there is no longer the condition of a fixed delay that is equal to half the transition time. This condition is necessary to ensure the linearity of the delay of the output signal in relation to the input instruction. To overcome this problem, French Patent No. 2 689 339 provides a modified primary circuit. A set of cascade-connected delay circuits is used, and the outputs of these cascade-connected delay circuits are connected to a multiplexer. The multiplexer is used for the selection (by way of intermediate signals) of pairs of signals possessing a fixed delay (as before) and a basic delay with respect to the input signal. When the range is being changed, technological delay gaps or discontinuities are observed. If the discontinuity is negative, it becomes impossible for the servo-control arrangement to find a balanced setting at an acceptable value. In the present invention, this problem is overcome by modifying the combination circuit so as to enable a full range to be used.

Yet another object of the present invention is to provide a delay circuit that is specially designed for fabrication using CMOS technology.

A preferred embodiment of the present invention provides a delay circuit having a primary circuit receiving an input signal and providing first and second intermediate signals having a fixed delay between them; a two-input combination circuit outputting a combination signal resulting from a superimposition, with a weighting as a function of the control variable and integration, of the inputted intermediate signals; and a shaping circuit receiving the combination signal and generating an output signal using a threshold effect. The combination circuit includes a control input receiving a control variable that represents the instruction, a common line with a capacitor connected to this common line and to a supply potential, and first and second modules for the charging and discharging of the common line, these modules being respectively controlled by the first intermediate signal and second intermediate signal, the potential of the common line constituting the measurement of the combination signal. Additionally, each module of the delay circuit has a discharging circuit and a charging circuit each comprising switching means controlling the connection between the common line and, respectively, a first supply potential and a second supply potential through a variable resistor and a non-variable resistor so as to provide for the permanent participation of the two modules in the charging and discharging of the capacitor. The switching means of the charging and discharging circuits of each module are activated by the intermediate signals.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIGS. 2a through 2c, 4a through 4c, 6a through 6c, and 8a through 8c show timing diagrams for the circuit of FIG. 1;

FIG. 16 shows a comparison of the delay times obtained as a function of the digital control with the circuits of FIGS. 11 and 15; and FIG. 17 shows a comparison between the delay times obtained with the circuit of FIG. 11 and those obtained with the circuit of FIG. 15.

DETAILED DESCRIPTION OF PREFERRED EMBODIMENTS

Preferred embodiments of the present invention will be described in detail hereinbelow with reference to the attached drawings.

Figure 1:
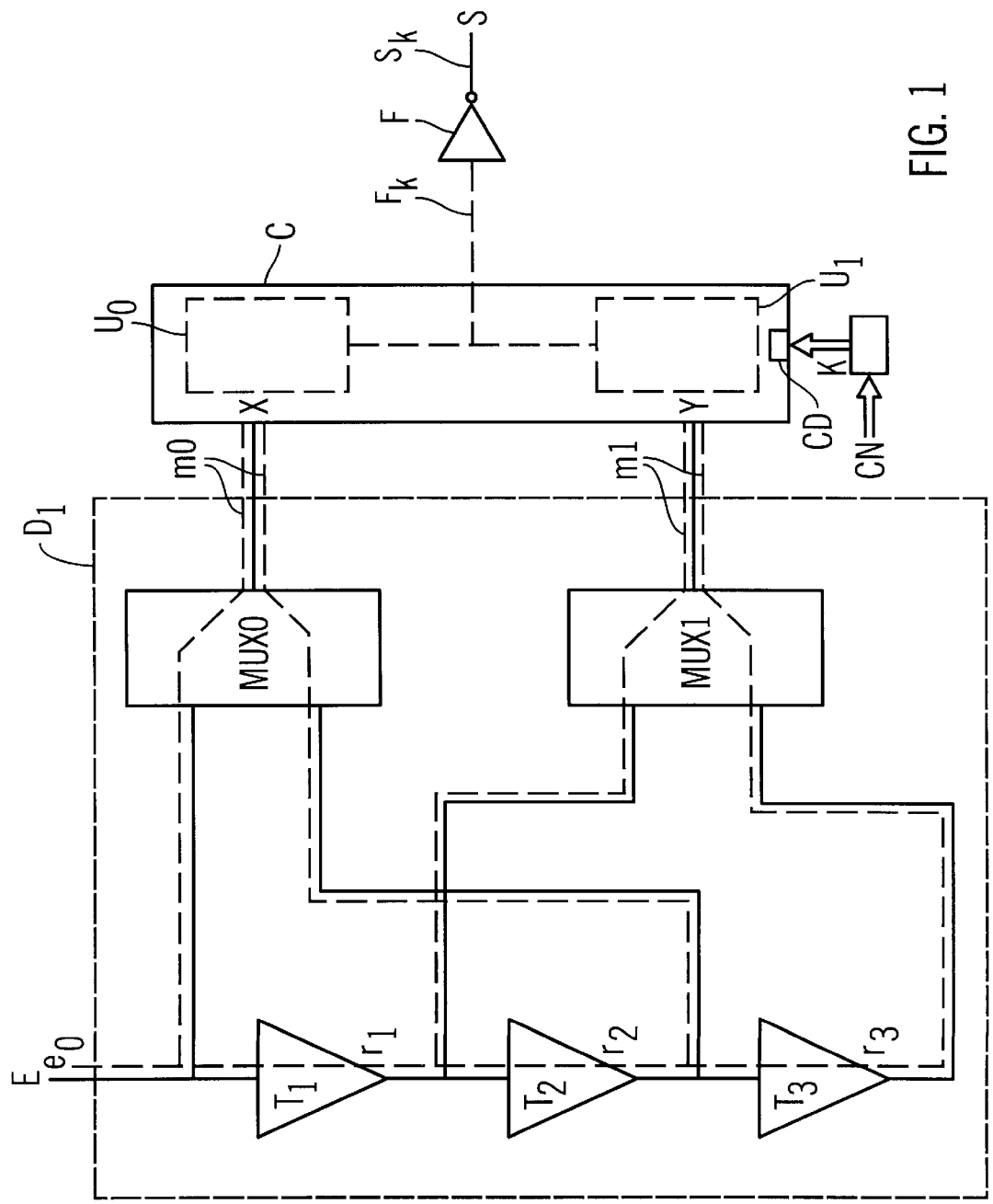
FIG. 1 shows a schematic diagram of a variable delay circuit with several ranges of delay.

A delay circuit according to an embodiment of the present invention is shown in FIG. 1. The circuit includes a primary circuit D1 with a fixed delay that receives an input signal e0 and outputs first and second intermediate signals m0 and m1. There is a fixed delay between the signals m0 and m1. The signals m0 and m1 are applied respectively to the inputs X and Y of a combination circuit C, which outputs a combination signal $f_k$. The combination circuit C has a control input CD that receives a command K representing weighting coefficients for the combination performed by the circuit C. The command K is a function of a delay instruction CN.

The combination signal $f_k$ is applied to the input of a shaping circuit F that outputs the output signal $S_k$. For simplification, standardized values of the signals are used in the following description, and it is assumed that the weighting coefficients assigned to the signals m0 and m1 are respectively the values K and 1−K, with K ranging from 0 to 1. In other words, the circuit C is designed to obtain the combination $g_k = K \times m0 + (1-K) \times m1$, with integration in relation to time to obtain $f_k$ from $g_k$.

The signal e0 reaches the input E of the circuit on a first buffer memory T1. In the preferred embodiment, three identical buffer memories T1, T2, and T3 are serially connected and used for the serial introduction of fixed delays to the signal e0. Preferably, the fixed delays are equal to one another and to T so that the signal e0 is delayed by T, 2 T, 3 T, etc. However, in further embodiments, the delays are different from one another. The signal r1 is output from the buffer memory T1, the signal r2 is output from the buffer memory T2, and the signal r3 is output from the buffer memory T3. The input of the first buffer memory is connected to an input of a first multiplexer MUX0, and the output of the buffer memory T2 supplies the other input of the multiplexer MUX0.

The outputs of the buffer memories T1 and T3 are connected to the inputs of a second multiplexer MUX1. The outputs of the multiplexers MUX0 and MUX1 are connected to the inputs of the combination circuit C to achieve a delay interpolation. The output of the combination circuit takes the signal $f_k$ to the shaping circuit F. The combination circuit consists of two modules U0 and U1. The interpolation is obtained between either the signals e0 and r1, or the signals r2 and r1, or the signals r2 and r3, which are the only combinations to have a constant delay of T between the signals. By supplying these three combinations of signals to the input of the combination circuit, it is certain that a constant range of delay will be obtained. The combination of the signals e0 and r3 is never supplied to the combination circuit because the delay between the two signals is too great and would not meet the conditions of linearity referred to above.

With this circuit, it is possible to place several delay ranges one after the other. The sequencing of these ranges is done by using a first combination (e0 r1) to produce a delay that is variable between 0 and T, a second combination (r1 r2) to produce a delay that is variable between T and 2 T, a third combination (r2 r3) to produce a delay that is variable between 2 T and 3 T, and so on. Thus, the number of buffer memories used and the capacity of the multiplexers set the total dynamic range for the delay of the delay circuits of the present invention.

Figures 2A, 2B, 2C:
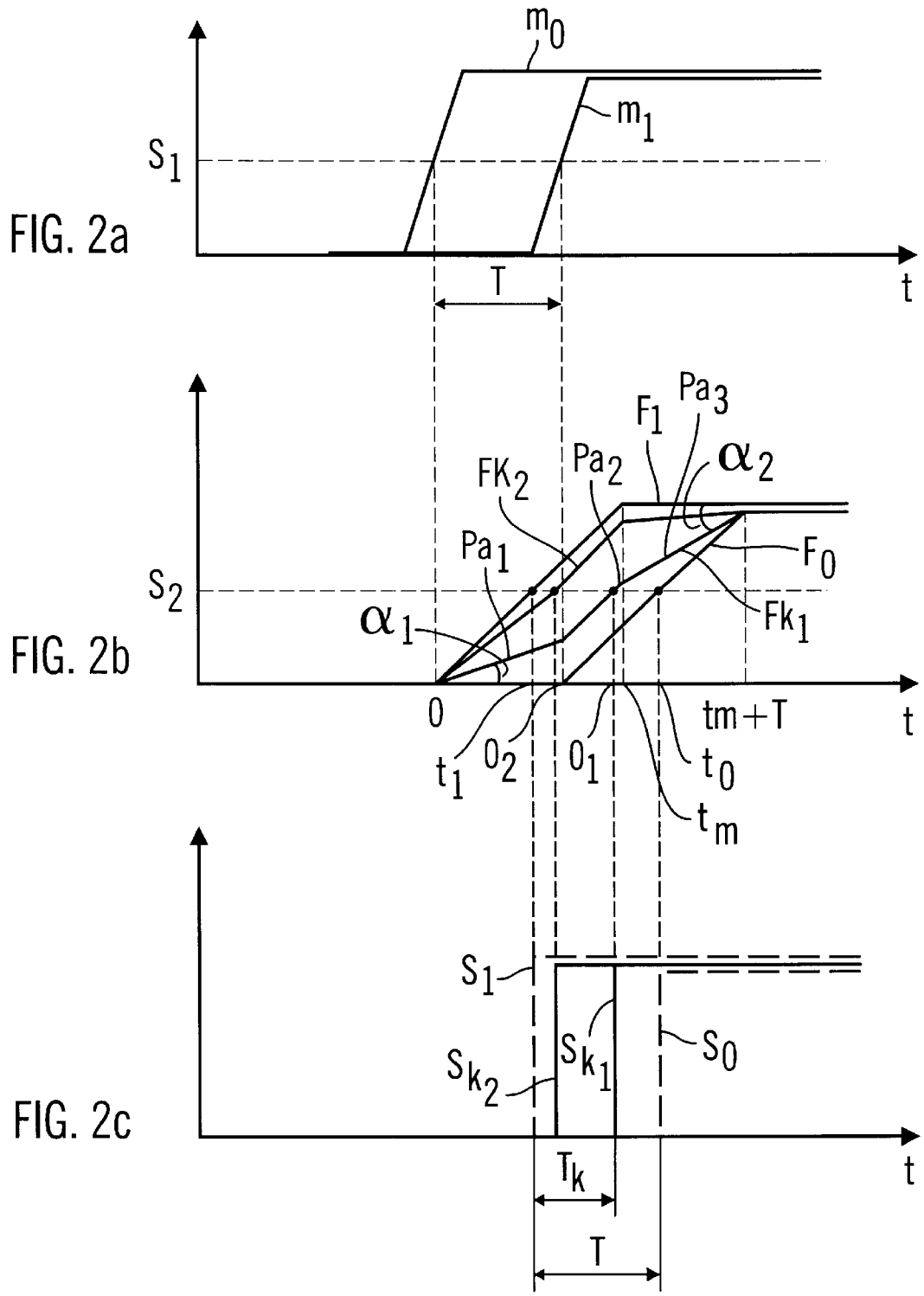
Figure 3:
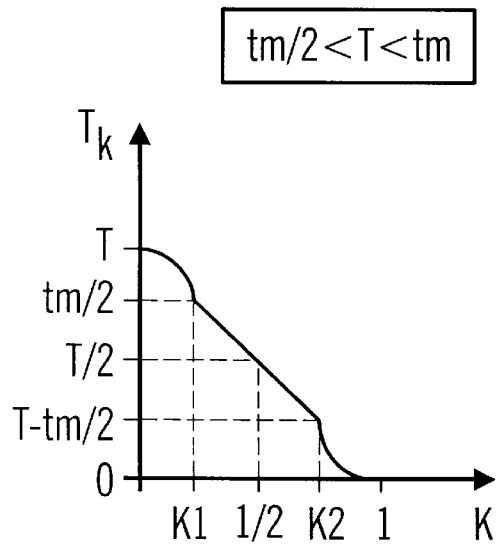
FIGS. 3, 5, 7, and 9 show the variations of the delay as a function of the control variable for different sizes of the circuit of FIG. 1.

The curves shown in FIGS. 2 to 9 explain the operation of the circuit of FIG. 1. These figures show the combination signals $f_k$ and of the output signals $S_k$ according to the comparison between the fixed delay T between the signals m0 and m1 and a transition time tm. The transition time tm is the time (presented by the combination circuit) to make the signal $f_k$ go from its minimum value to its saturation value when K equals 0 or 1. Furthermore, the figures show the variations of the delay $T_k$ as a function of the coefficient K for different values of the transition time tm, the fixed delay T being assumed to be fixed. The case where T ranges from tm/2 to tm is shown in FIGS. 2 and 3.

The timing diagram shown in FIG. 2a shows the signals m0 and m1 applied to the inputs X and Y of the combination circuit C. Because the signal m0 is a logic signal, it has a steep transition edge between the first and second levels which is later followed by another edge (not shown) restoring the signal to its first level. The trailing edge represents the end of the pulse of the signal R0, which is to be delayed. The duration of this pulse is great as compared with T, 2 T, 3 T, etc. The delayed signal m1 has been shown as a signal identical to m0 but delayed by a delay T defined by the circuit D1.

In practice, the edge of the signal m0 is exploited by the combination circuit at the instant when the signal m0 reaches the threshold value $S_1$ of the combination circuit C. In general, the threshold value $S_1$ corresponds to the mean between the minimum level and the maximum level of the signal m0. This is also the case for the signal m1. Should the threshold value be set at another level, the signals m0 and m1 could have a different shape. The delay T is defined as the time interval between the instants when the signal m0 and the signal m1 reach the threshold value.

The timing diagram of FIG. 2b represents the combination signal $f_k$ for different values of the weighting coefficient K. Naturally, the shape of the signals shown is a simplified representation of the signals that are obtained with real circuits. However, this representation is not far from reality. In particular, a steady level of saturation will always be seen. This is shown in the curve $F_1$ (K=1) from t=tm and on the other curves from t=tm+T. The integral of a pulse is ultimately limited to the values of the supply potential. In the shaping circuit F, the signal $f_k$ is compared with a threshold value $S_2$ which is preferably at the mean level between the maximum and the minimum of $f_k$.

When the comparator switches over, the output signal is produced with a delay with respect to the signal e0. The signal $F_1$ corresponds to the case where K is equal to 1, namely when the weighting coefficient applied to the signal m1 is zero. The signal has a trapezoid shape with its leading edge starting at the instant zero corresponding to the instant when the signal m0 reaches a threshold value $S_1$. The signal $F_1$ increases linearly, the integration of a constant being a refined function, up to the instant tm when it reaches a saturation level. The signal $F_0$ corresponds to the case where the weighting coefficient K applied to the signal m0 is zero. This signal reproduces the signal $F_1$ with the delay T.

For weighting coefficients different from these two extreme cases, the combination signal has the shape shown by the curves $f_{k1}$ and $f_{k2}$. The curve representing the combination signal then has three distinct parts Pa1, Pa2, Pa3. The portion Pa1 corresponds to the time interval during which the signal m1 has not yet reached the threshold $S_1$. The signal $f_{ki}$ is then proportional only to the signal m0. The portion Pa3 of the curve representing $f_{ki}$ corresponds to the time interval starting from which the signal $F_1$ reaches saturation. The signal $f_{ki}$ is then solely proportional to the signal m1.

The portion Pa2 corresponds to the time interval between the arrival of the signal m1 at its threshold value and the arrival of $F_1$ at saturation. The signals $F_1$ and $F_0$ reach the threshold value $S_2$ respectively at the instants t1 and t0 while the signal $f_{ki}$ reaches this threshold at the signal $\Theta_i$. The difference between t1 and t0 is equal to the delay T. Thus, the minimum and maximum delays respectively of the combination signal with respect to the input signal are included between t1 and t0. Consequently, the delay obtained in general will have a value $\Theta$ ranging from t1 to t1+T. The timing diagram of FIG. 2c represents the output signal of the shaping circuit F in each of the three cases shown in the timing diagram of FIG. 2b. Thus, the signals $S_1$ and $S_0$ present one edge at the instants t1 and t0. For a given coefficient K, the output signal $S_k$ will have an edge delayed by a value $T_k$ with respect to the signal $S_1$, the value $T_k$ ranging from 0 to T (i.e., t1+T with respect to m0).

FIG. 3 shows that for K ranging between 0 and a first value K1, $T_k$ varies between T and tm/2 in a sinusoidal value. The first value K1 corresponds to the coefficient 1–K as a factor of m1 which coincides with the delay $\Theta$ equal to tm. For K ranging from 0 to K1, the value $\Theta$ obtained (which is characteristic of the delay) varies as the cosine of an angle $\alpha 2$ measuring the angle between the portion Pa3 of the curve $f_k$ and the horizontal. It can easily be verified by computation that K1 equals 1–tm/2 T (for example, by establishing an equation of the straight line containing the curve portion Pa3).

Figure 5:
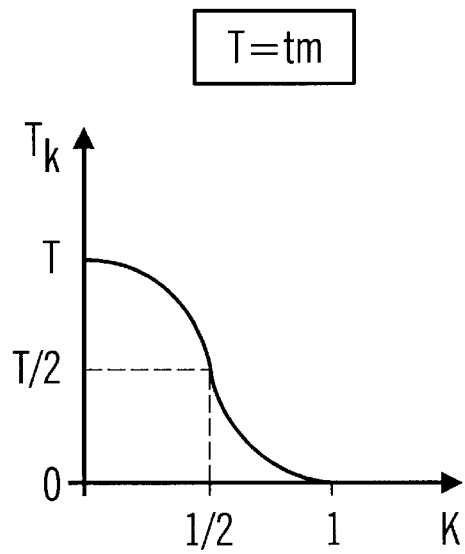

Similarly, for K ranging from K2 to 1, the value $\Theta$ obtained varies as the cosine of the angle $\alpha 1$ measuring the angle between the portion Pa1 of the curve and the horizontal. In the same way as K1 was computed, it is possible to compute K2=tm/2 T. Between K1 and K2, the portion Pa2 of the curve $f_k$ is parallel to f1 and f0. Indeed it is the result of a linear combination of two parallel straight lines, the straight lines bearing the curves representing f0 and f1. Hence, for K ranging from K1 to K2, the delay values $\Theta$ are the result of a linear function of K. FIGS. 4 and 5 represent the case where T equals tm. In this case, the values K1 and K2 defined here above are equal and the linear portion of the delay $T_k$ as a function of K has disappeared. The delay function $T_k$ (assuming that K is a variable) is then never linear.

Figure 7:
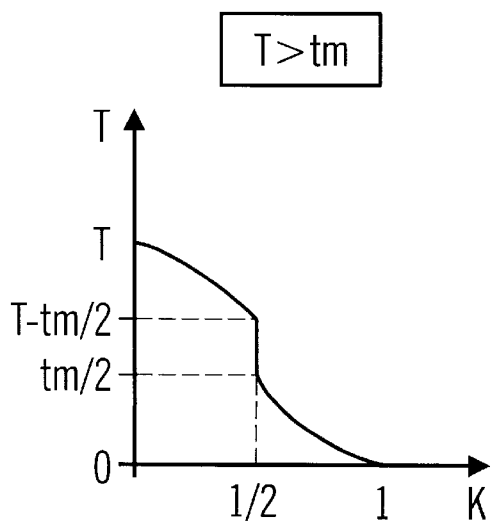
Figure 9:
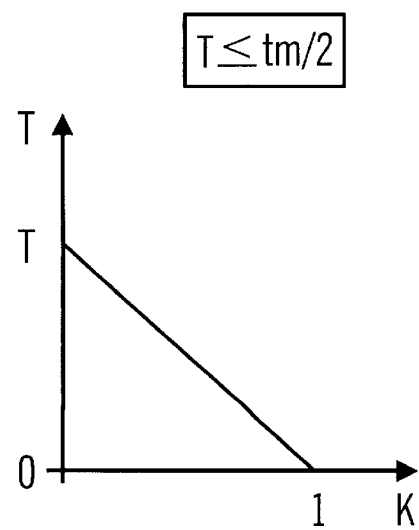

FIGS. 6 and 7 shows the case where T is greater than tm. In this case, the portion Pa2 of the signal $f_k$ is horizontal because it is the linear combination of $F_1$ and $F_0$ which, on the interval considered, are horizontal. If K is equal to ½, this horizontal portion of the signal $f_k$ is then located at the level of the transition threshold $S_2$. The delay is then not perfectly defined. It is somewhere in the interval Z of the timing diagram C of FIG. 6, creating a discontinuity at the level of the curve $T_k$ as a function of K, as shown in FIG. 7. FIGS. 8 and 9 represent the case where T is smaller than tm/2. In this case, the threshold $S_2$ cannot be reached except with the portion Pa2 of the curve $f_k$, the response of which is necessarily linear as can be seen in FIG. 9.

Thus, the way in which the delay Θ varies as a function of the weighting coefficient K therefore essentially depends on the transition time tm and the fixed delay T. The transition time tm defines the minimum delay t1 of the output signal $S_k$ with respect to the input signal e0. In the perfectly linear case, this minimum delay is equal to half the transition time. To resolve the problem of the duration of the delay, several serially connected delay circuits have been planned. For the delays existing between the combinations of signals e0 r1, r1 r2, and r2 r3, it is preferably chosen to have values T smaller than tm. However, this is not always necessary. As the case may be, some linearity would be lost.

The above analysis makes it possible to draw some conclusions concerning the dimensions to be given to the primary circuit and the combination circuit. First, T is preferably smaller than tm so as to prevent any discontinuity in the delay $T_k$ as a function of the weighting coefficient K, hence the delay instruction. Second, a linear response of the delay $T_k$ is obtained as a function of K once T is smaller than or equal to tm/2. Thus, for tm as a fixed value, a linear response will be obtained while at the same time the greatest setting range is obtained when T is equal to tm/2. The fixed delay T determines the range for the setting of the delay. Thus, for a specified range, it will always be possible to obtain a linear response by choosing tm=2 T. It could be necessary however to choose a smaller transition time in order to reduce the minimum delay t1, which directly depends on the transition time tm. In general, the choice of T and tm will result from a compromise between the minimum delay, the setting range, and the linearity of the delay with respect to the delay instruction.

Figure 10:
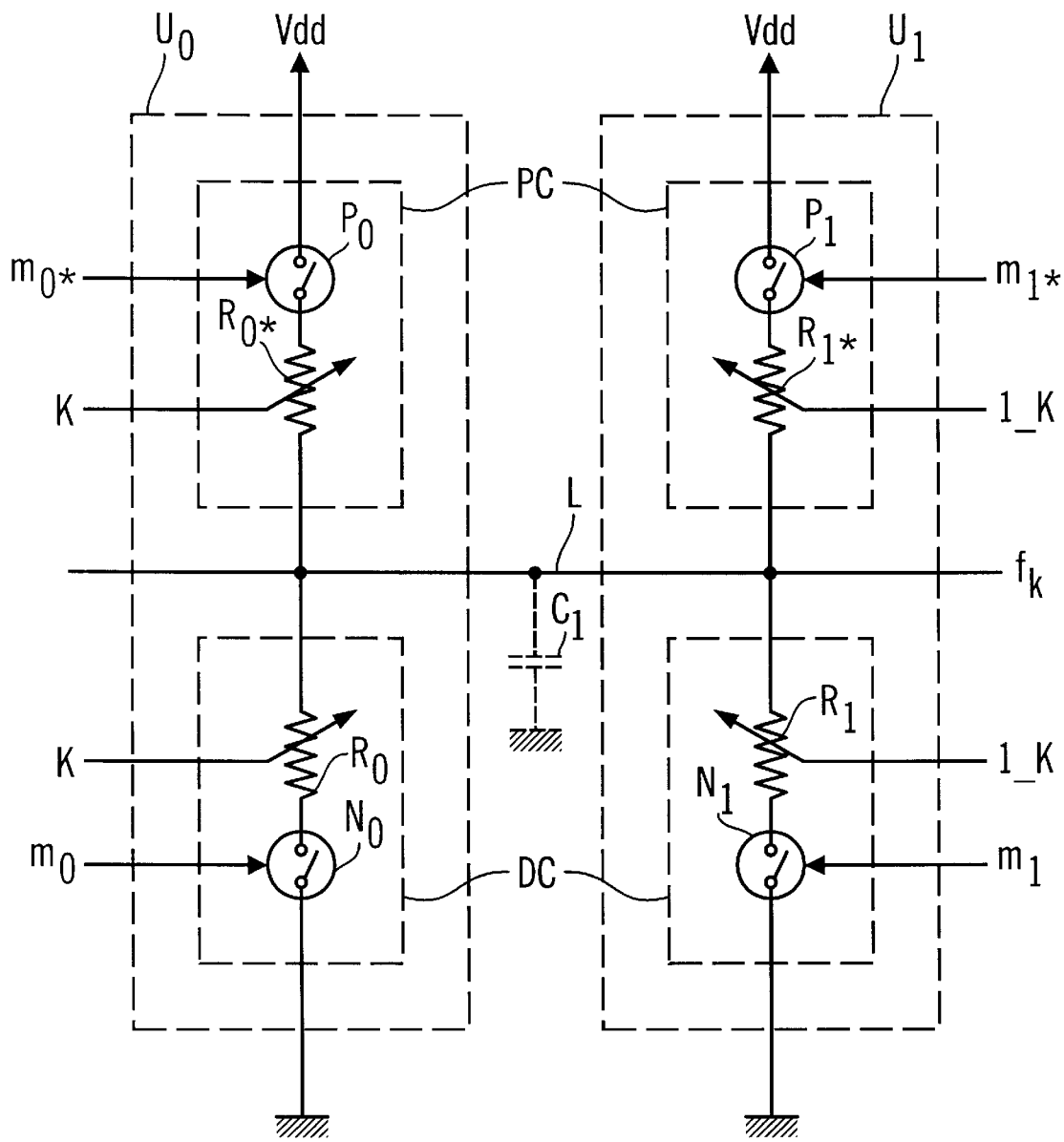
FIG. 10 shows a schematic diagram of a CMOS version of a variable delay circuit with several ranges of delay.
Figure 11:
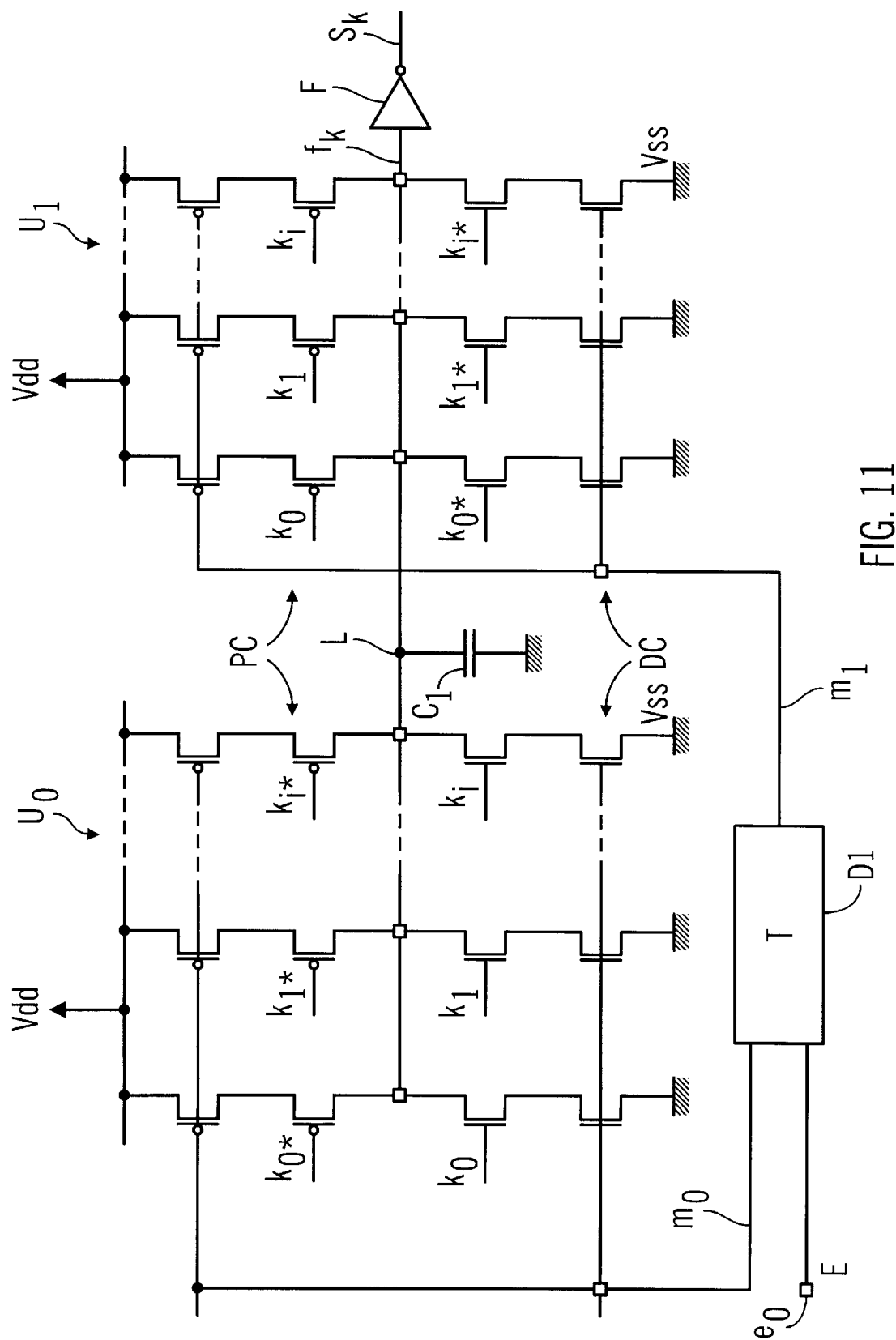
FIG. 11 shows a detailed embodiment for the circuit of FIG. 10.

FIGS. 10 and 11 relate to an embodiment of the combination circuit C using CMOS technology. The circuit of FIG. 10 includes a first charging and discharging module and a second charging and discharging module U0 and U1 of a common line L. The common line L is connected to a capacitor C1 and the capacitor C1 is connected to ground or another constant potential. The constant potential may be Vdd, with the working of the circuit then being reversed. The potential of the common line constitutes the measurement of the combination signal.

Each module U0 and U1 includes a charging circuit PC and a discharging circuit DC. Each charging circuit PC has a variable resistor R0* for the module U0, resistor R1* for the module U1, switch P0 for U0, and switch P1 for U1. Each discharging circuit DC includes a variable resistor R0 for U0, resistor R1 for U1, switch N0 for U0, and switch N1 for U1. Each switch controls the connection to the corresponding resistor between the line L and the supply potential Vdd for the charging circuit and Vss for the discharge circuit. The switches of the units U0 and U1 are respectively controlled by the signals m0 and m1 and their complements m0* and m1*. The variable resistors R0 and R0* are controlled so as to take a value inversely proportional to the coefficient K, while the resistors R1 and R1* of the unit U1 are controlled so as to take a value inversely proportional to 1−K. The potential of the line L constitutes the measurement of the combination signal $f_k$.

To explain the working of the circuit of FIG. 10, it is assumed that initially the line L is charged to the potential Vdd and that the signals m0 and m1 are at zero. The switches P0 and P1 are then closed while the switches N0 and N1 are open. When the signal e0 becomes active, the switch N0 gets closed and the switch P0 opens. The circuit then has a time constant defined by the capacitor at the line L and a resistance equivalent to the value of the parallel-connected resistors R0 and R1*. Since R0 and R1* are inversely proportional to K and 1−K respectively, the time constant is independent of K. The line L will then get discharged with this time constant from the value Vdd to the value (1−K) Vdd. The discharging continues in this way until the time when the signal m1 becomes active. Thereupon, the switch N1 gets closed and the switch P1 opens. The line L will then continue to get discharged towards zero with the same time constant as above. When the signal m0 becomes inactive again, the switch P0 closes and the switch N0 opens. This sets up a circuit for charging the line L to the voltage K Vdd. When m1 becomes inactive again, there is a return to the initial situation.

FIG. 11 shows in detail CMOS circuit for the circuit of FIG. 10. The charging circuit PC and the discharging circuit DC are constituted by P channel and N channel MOS transistors respectively. The variable resistors R0, . . . , R1* are formed by means of parallel connected MOS transistors controlled by the signals K0, . . . , Ki, and their complements K0*, . . . , Ki*. The associated switches are formed by the drain/source paths of the MOS transistors whose gates receive the associated signal e0, e1. The structural capacitance defining the time constant is due to the drain/gate capacitance of the active MOS transistors connected to the line L.

In this circuit, the resultant capacitance remains constant, and is independent of the value of K. Furthermore, the MOS transistors constituting the variable resistors of each charging or discharging circuit may be sized so that their resistance varies by a power of 2, depending on the weight of the control signals K0, . . . , Ki, . . . , K0*, . . . , Ki*. FIG. 11 also shows the delay circuit D1 connected to receive e0 and delivering the signals m0 and m1 and the shaping circuit F for providing for the passage from $f_k$ to $S_k$. When m0 is at 1, the transistors at the bottom of the figure are conductive, so the capacitor C1 gets discharged. When m0 is at 0, the transistors at the top are conductive, so the capacitor C1 gets charged.

When the commands of the module U0 are validated (namely, when all the ki values are at 1, and when m0 is at 0), the capacitance C1 is charged with a minimum delay. It is then possible to make the values ki go to 0 at the time of the setting or programming. The values of ki are no longer modified when the delay to be imposed is determined. Thus, gradually as a function of need, branches of the module U1 are activated. The capacitor C1 continues to get charged, but with a certain delay. Finally, when all the commands ki are at 0, the current flows solely through the module U1 and the delay is then the maximum for the charging of the capacitor C1.

The phase of discharging the capacitor follows the principle described here above for the charging with m0 equal to 1, and hence even more with m1 equal to 1. It is thus possible to obtain a delay for the rising of the signals m0 and m1 (their passage from 0 to 1) and for their descent (their passage from 1 to 0). In order to ensure the linearity of the delay, it is necessary that the capacitor should be charged to Vdd. It is therefore first necessary that the pulse should be fairly long so as to totally charge to Vdd. With a pulse e0 having a high level of 5 ns corresponding to a frequency of 100 MHz, this raises no problem. The potential of the capacitor C1, which can be read at the node L, is the potential of the signal $S_k$. It is only when this potential reaches the threshold of the shaping circuit F that the signal $S_k$ is switched over.

Figure 12:
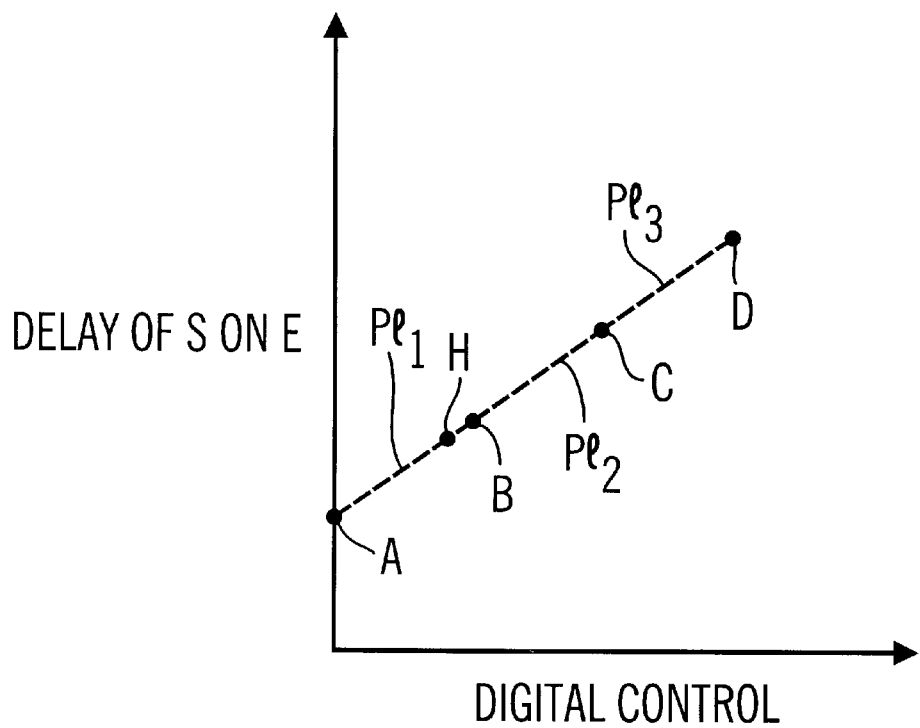
FIG. 12 shows a theoretical curve representing delay times as a function of the digital control.

In the circuit of FIG. 11, there is obtained a delay range determined solely by the delay between the signals m0 and m1. From a technological viewpoint, there is henceforth need for greater ranges of delay. Thus, the system of FIG. 1 with a multiplexer has been provided. However, this approach is not always satisfactory as will be explained with reference to FIGS. 12 and 13. FIG. 12 shows a curve representing the delay between the input E and the output S of the circuit of FIG. 11 as a function of the digital control signal. Five characteristic points can be seen on the curve.

The point A corresponds to the minimum delay (hence, to the case where it is the signals e0 and r1 that enter the combination circuit) with 100% of the current that flows into the module U0. The point B corresponds to the maximum delay when e0 and r1 enter the combination circuit with 100% of the current that flows into the module U1. The segment extending from A to B constitutes the range P11. When the delay to be prompted is greater than that of point B, the multiplexer MUX0 alone is switched. It is then possible to reach a second delay range P12. This second range P12 ends at a point C corresponding to the maximum delay between r1 and r2 with 100% of the current flowing through the module U0.

Figure 15:
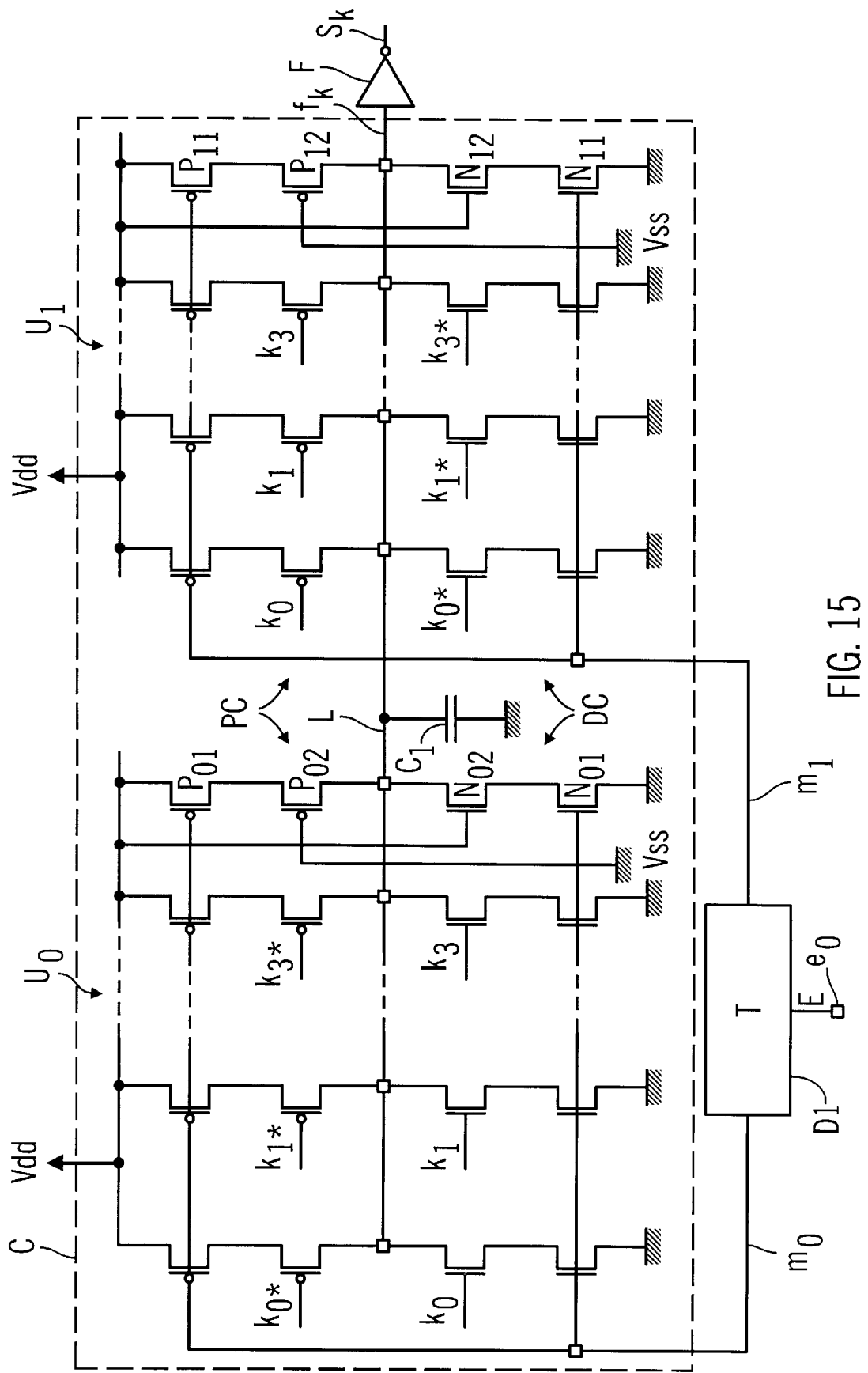
FIG. 15 shows the improvement of the linearity of the delay as a function of the digital control.

The advantage of the connection mode recommended makes it possible to switch only a multiplexer (MUX0) in taking account of the symmetrical character of the circuit of FIGS. 11 and 15. Then, it is the turn of the multiplexer MUX1 to switch over, the signal r1 leaving its place for the signal r3. It is thus possible to start a third range P13 of the delay curve and the point D is reached. The point D corresponds to a maximum delay between r2 and r3 with 100% of the current that flows through module U1. If we consider the point H located on the first range of the delay curve, it can be said that, at this point, approximately 90% of the current flows through the module U0 and 10% flows through the module U1.

Figure 13:
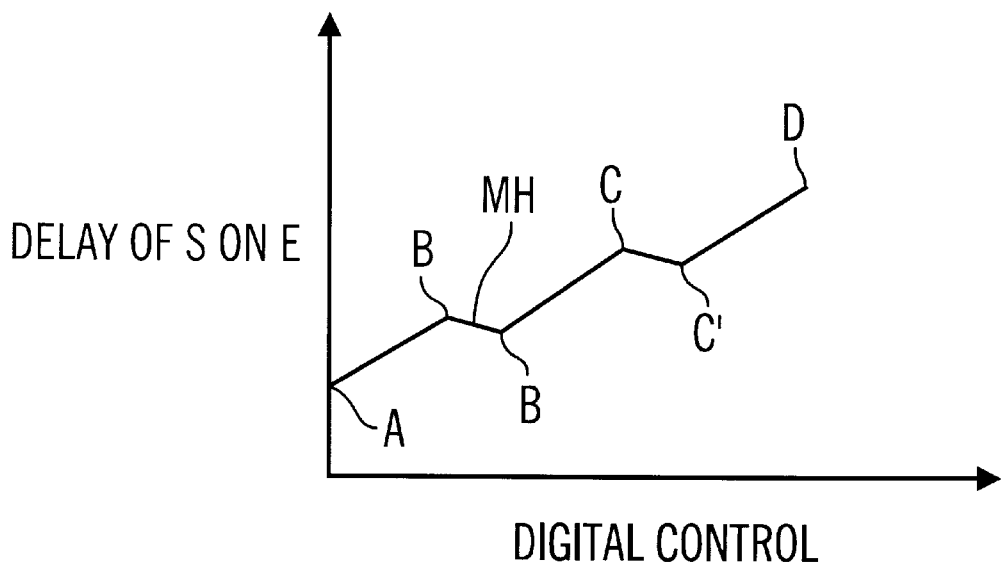
FIG. 13 shows a curve representing the delay times actually observed in the variable delay circuit with several delay ranges as a function of the digital control.

However, this curve remains theoretical. In practice, the curve shown in FIG. 13 is obtained. It is seen in this curve that, when the multiplexers switch over, there is a non-linearity of the delay curve as a function of the digital command. This non-linearity is expressed by a flat portion MH that is horizontal or, worse still, tilted downwards. The position of the points X and X' that respectively designate the last point of a range and the first point of the next range, cannot be used to obtain a linear curve. Furthermore, it is not monotonic any longer because the flat portions MH joining the points X and X' are descending portions. This type of problem can be explained by current leakages, injections of charge from the output to the input or problems of charge distribution at the capacitor C1.

Figure 14:
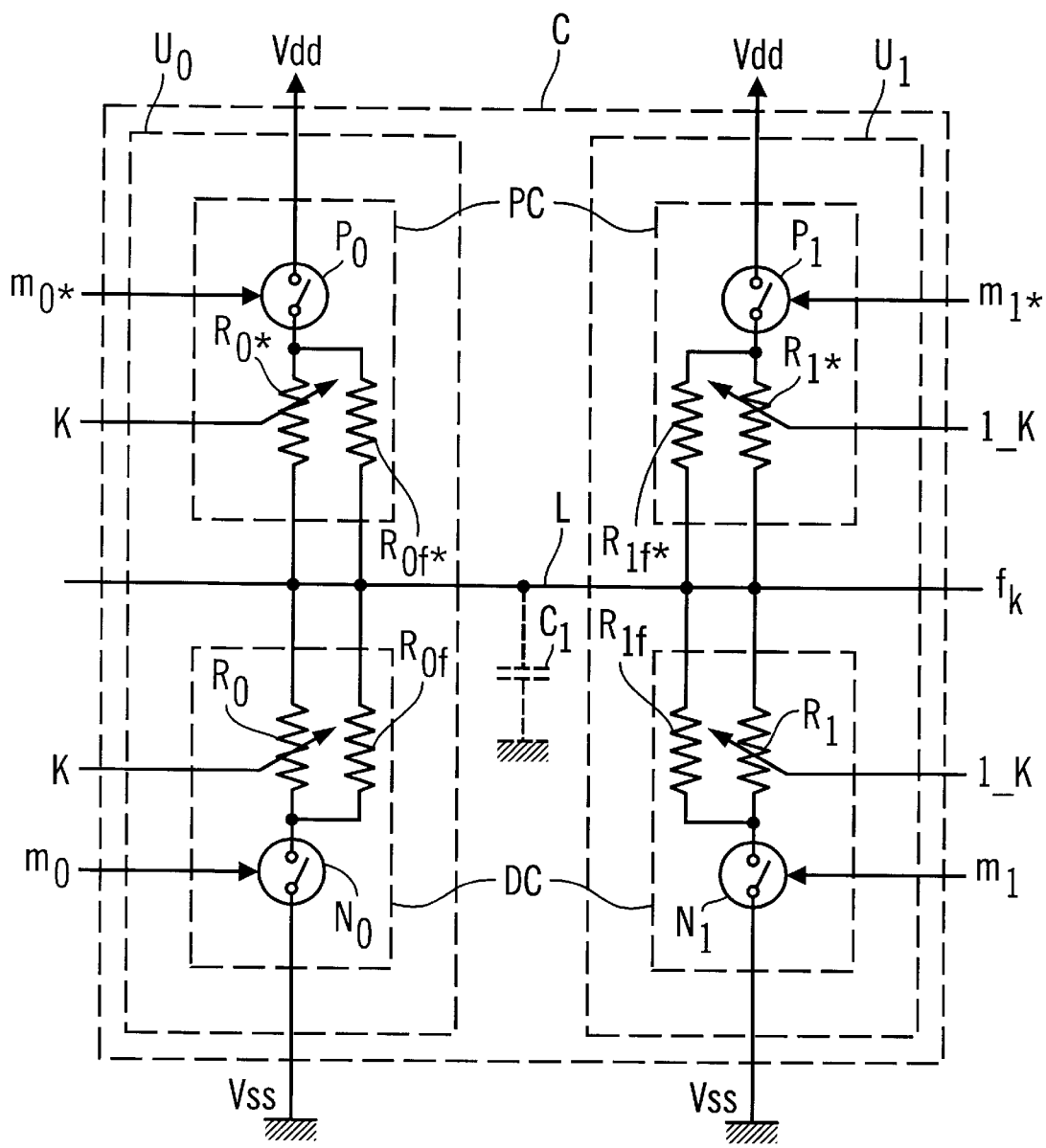
FIG. 14 shows the improvement of linearity of the delay as a function of the digital control.

FIGS. 14 and 15 present a solution to this problem according to the present invention. FIG. 14 is similar to the circuit of FIG. 10 and shows the two modules U0 and U1 that constitute the combination circuit C. Four non-variable resistors R0f, R0f*, R1f, and R1f* are added to the circuit. These resistors are parallel-connected respectively to R0, R0*, R1 and R1*. These non-variable resistors no longer depend on K. They ensure that each module U0 and U1 permanently contribute to the charging or discharging of the line L. The advantage of this will be described with respect to FIG. 15, which shows a more detailed description of this circuit.

FIG. 15 is similar to the circuit of FIG. 11. The multiplexers MUX0 and MUX1 and the buffer memories T1, T2, and T3 constitute the delay circuit D1. To each of the two modules U0 and U1 that constitute the combination circuit C, a parallel-connected arm has been added. These arms each comprise, in series, two serially connected P channel transistors and two serially connected N channel transistors. The P channel transistors P01 and P02 for U0, and P11 and P12 for U1, operate in the same way as the P channel transistors in the circuit of FIG. 11 in the charging circuits of U0 and U1.

The new N channel transistors N01 and N02 for U0, and N11 and N12 for U1, operate similarly in the discharging circuits of U0 and U1. The added transistors P01, N01, P11 and N11 that act as switches are still connected to the signals m0 and m1. However, the transistors that serve as variable resistors P02, N02, P12, and N12 are permanently supplied: the added N channel transistors N02 and N12 are connected to the potential Vdd and the added P channel transistors P02 and P12 are connected to the potential Vss. They do not depend on a command K or K*. Hence, the additional arms are still conductive. This compensates for the leakages and problems of charge distribution that can be observed during the switching of the multiplexers. This results in a horizontal or slightly decreasing flat portion, so the distributions of the currents in the modules U0 and U1 are slightly modified. It is thus no longer possible to have 100% of the current flowing in one module and 0% in the other.

In the practical embodiment, each module typically includes three transistors controlled by the commands K and K*. The added transistor that is permanently connected to the potential Vdd or Vss will typically be smaller than the other three transistors so that there is at most 90% of the current that can flow through a module U0 or U1. This means that the permanently supplied transistor must be three times smaller than the other transistors. In another common application, the transistors controlled by the coefficients K0, K1, etc. have gate widths in binary progression (1, 2, 4, etc.). The transistor added to the additional arm has a gate width that is half of the smallest of the previous gate widths. It is also possible to have another implementation in which there are seven identical arms. In this case, the added arm has a gate width that is half that of the other arms.

FIGS. 16a, 16b, 16c, 16d, and 16e explain what now happens on the first range. In their description, reference will often be made to the circuit of FIG. 15. FIG. 16a and 16b are the timing diagrams of the signals m0 and m1 offset by a time T. The starting point of the time is defined when m0 switches to 0. Let it be assumed that all the coefficients ki are at 1. This corresponds to K=1 and to a minimum delay equal to t1 (see FIGS. 2b, 4b, 6b, and 8b). This is at the beginning of a range, and the current essentially flows through the module receiving the signal with the smallest delay. For a time interval ranging from 0 to T, all the P channel transistors of FIG. 15 controlled by the coefficients K* are conductive and contribute to the charging of the capacitor C1.

However, since m1 equals 1, the N channel transistors N12 of FIG. 15 contributes to the discharging of C1 which occurs only when there are no transistors added by the invention. Thus, the threshold value $S_2$ defined above is reached later, as illustrated in FIG. 16c. The curves Co and Ci respectively correspond to the charging of the capacitor C1 before and after the introduction of the permanently connected transistors. The times t1 and ti are respectively the times taken, before and after the improvement of the invention, by the signal $S_k$ to reach the threshold value $S_2$. Hence, at the beginning of the range, there is a delay ti greater than t1. It can be seen in FIG. 16c that once m1 has switched over to 0, the charging of the capacitor C1 is faster than it was earlier. This can be explained by the fact that P11 then takes part in the charging of C1.

Let it now be assumed that all the values of ki are equal to 0. This corresponds to K=0 and to a maximum delay equal to t0 (see FIGS. 2b, 4b, 6b, and 8b). This is at the end of a range and the current flows essentially through the module receiving the most delayed signal. For a time interval ranging between 0 and T, for the module U0, only the transistor P01 contributes to the charging of the capacitor C1. However, because m1 is at 1, all the N channel transistors of the module U1 favor the discharging of C1, so the capacitor therefore does not get discharged. Beyond this time interval, m1 is at 0 and all the P channel transistors of the module U1, as well as P01, contribute to the charging of C1. The charging of the capacitor C1 is therefore faster than it was when P01 was not present in the circuit. Therefore, at the end of the range, there is a delay tj that is smaller than t0.

A similar form of reasoning can be applied to the passage from a low level to a high level and for the discharging of the capacitor. In any case, the new delay at the beginning of the range is greater than the one when there are no arms permanently connected, and it is smaller at the end of the range. Hence, on a range, there is obtained the curve shown in FIG. 16a. The points $S_1$ and B1 are those of the new delay curve. The points $S_1$ and B1 are respectively above and below the previous points A and B (FIG. 12).

FIG. 17 explains the change in range by using dashes to show the real curve of the delays caused without the improvement. This is the curve a b b' c c' d d' which is a jagged line. The curve representing the delays obtained with the improvement of the invention is shown in a solid line. This line passes through the points a1 b1 b'1 c1 c'1 d1 d'1 which are all aligned. The delay associated with the point b1 is far smaller than that associated with the point b while the delay associated with the point b'1 is greater than that associated with the point b'. When a multiplexer (MUX0 or MUX1) switches over, a start is made on a new range. The first delay of the new range is greater, with the circuit of FIG. 15, than that obtained with the circuit of FIG. 11. The advantage is that, even when the multiplexers are switched, the delay will be necessarily increased. The addition of the differences to–tj of the "low" range and ti–t1 of the high range are together greater than the drifts ab' or cc' of FIG. 13.

The digital command could therefore achieve a more efficient control of the values of the coefficients ki and the switching of the multiplexers. Indeed, if this command results from a servo-controlled action, the fact that the servo-control function has a negative slope (b b', c c') and especially a peak, at b or at c, of the gain curve, leads this servo-control function to oscillate around the value associated with the point b. FIG. 17 also shows the comparison between the delay curves obtained: the curve Co1 representing the delay time when there are no arms permanently connected and the curve Co2 characteristic of the delay time for the circuit comprising the permanently connected arms. The curve Co2 shows that an optimal linearity is approached. The delay is thus in any case still increased.

What is claimed is:

1. A delay circuit for providing an output signal that has a delay with respect to an input signal, the delay being adjustable as a function of a delay instruction, said delay circuit comprising:
   a primary circuit that receives the input signal and outputs first and second intermediate signals, there being a fixed delay between the first and second intermediate signals;
   a combination circuit that receives the first and second intermediate signals and outputs a combination signal; and
   a shaping circuit that receives the combination signal and outputs the output signal based on a threshold level,
   wherein the combination circuit includes:
      a control input that receives a control variable representing the delay instruction;
      a capacitor connected between a common line and a first supply potential; and
      first and second circuit modules that charge and discharge the capacitor through the common line, the first circuit module being controlled by the first intermediate signal and the second circuit module being controlled by the second intermediate signal, the common line providing the combination signal,
   wherein each of the circuit modules includes a charging circuit and a discharging circuit, each of the discharging circuit having a switch for selectively coupling the common line to the first supply potential through one variable resistor and one non-variable resistor that are connected in parallel, each of the charging circuits having a switch for selectively coupling the common line to a second supply potential through one variable resistor and one non-variable resistor that are connected in parallel, wherein the non-variable resistor is independent of the control variable received on the control input and the non-variable resistor causes each of the first and the second circuit modules to contribute current so as to form the output signal which is linear over a time period provided by the delay instruction, the switches of the charging and discharging circuits being controlled by the first and second intermediate signals from the primary circuit.

2. The delay circuit as defined in claim 1, wherein the fixed delay is less than a transition time of the combination signal when the combination circuit receives only one of the two intermediate signals.

3. The delay circuit as defined in claim 1, wherein the combination signal is formed by a superimposition of the first and second intermediate signals, the superimposition including a weighting as a function of the control variable and an integration.

4. The delay circuit as defined in claim 3,
   wherein the weighting is performed by weighting the first intermediate signal by a first weighting coefficient and weighting the second intermediate signal by a second weighting coefficient,
   the values of the first and second weighting coefficients are a function of the control variable, and
   the sum of the first and second weighting coefficients is constant.

5. The delay circuit as defined in claim 4, wherein each variable resistor is controlled so as to take a value that is inversely proportional to one of the weighting coefficients.

6. The delay circuit as defined in claim 5, wherein each variable resistor is formed using a set of elementary resistors that can be selectively connected in parallel as a function of the weighting coefficient associated with that variable resistor.

7. The delay circuit as defined in claim 6, wherein the variable resistors, the nonvariable resistors, and the switches are all formed by drain-source paths of MOS transistors whose gates are controlled as a function of the weighting coefficients or by constant potentials.

8. The delay circuit as defined in claim 7, wherein each circuit module includes three branches that are controlled by weighting signals and a fourth branch that is permanently conductive, each branch containing serially-connected MOS transistors.

9. The delay circuit as defined in claim 8, wherein the primary circuit includes:
a plurality of serially-connected buffer memories that includes first, second, and third buffer memories, each buffer memory delaying the input signal by a delay,
wherein the input signal and an output of the second buffer memory are supplied to a first multiplexer,
an output of the first buffer memory and an output of the third buffer memory are supplied to a second multiplexer, and
the first and second multiplexers output the first and second intermediate signals.

10. The delay circuit as defined in claim 1, wherein the primary circuit includes a plurality of serially-connected buffer memories that includes first, second, and third buffer memories, each buffer memory delaying the input signal by a delay.

11. The delay circuit as defined in claim 10,
wherein the input signal and an output of the second buffer memory are supplied to a first multiplexer,
an output of the first buffer memory and an output of the third buffer memory are supplied to a second multiplexer, and
the first and second multiplexers output the first and second intermediate signals.

12. A combination circuit for a delay circuit of the type having a primary circuit that receives an input signal and outputs first and second intermediate signals having a fixed delay therebetween, and a shaping circuit that receives a combination signal and generates an output signal based on a threshold level, the combination circuit receiving the first and second intermediate signals and outputting the combination signal, said combination circuit comprising:
a control input that receives a control variable representing a selected delay;
a common line that provides the combination signal,
a capacitor connected between the column line and a first supply potential;
a first circuit module having a first charging circuit and a first discharging circuit for charging and discharging the capacitor through the common line, the first circuit module being controlled by the first intermediate signal; and
a second circuit module having a second charging circuit and a second discharging circuit for charging and discharging the capacitor through the common line, the second circuit module being controlled by the second intermediate signal,
wherein each of the discharging circuits includes a switch for selectively coupling the common line to the first supply potential through one variable resistor and one non-variable resistor that are connected in parallel, wherein the non-variable resistor is independent of the control variable received on the control input and the non-variable resistor causes each of the first and the second circuit modules to contribute current so as to form an output signal which is linear over a time period provided by the selected delay,
each of the charging circuits having a switch for selectively coupling the common line to a second supply potential through one variable resistor and one non-variable resistor that are connected in parallel, and the switches of the charging and discharging circuits are controlled on the basis of the first and second intermediate signals.

13. The combination circuit as defined in claim 12, wherein the fixed delay is less than a transition time of the combination signal when the combination circuit receives only one of the two intermediate signals.

14. The combination circuit as defined in claim 12, wherein the combination signal is formed by a superimposition of the first and second intermediate signals, the superimposition including a weighting as a function of the control variable and an integration.

15. The combination circuit as defined in claim 14,
wherein the weighting is performed by weighting the first intermediate signal by a first weighting coefficient and weighting the second intermediate signal by a second weighting coefficient,
the values of the first and second weighting coefficients are a function of the control variable, and
the sum of the first and second weighting coefficients is constant.

16. The combination circuit as defined in claim 15, wherein each variable resistor is controlled so as to take a value that is inversely proportional to one of the weighting coefficients.

17. The combination circuit as defined in claim 16, wherein the variable resistors, the non-variable resistors, and the switches are all formed by drain-source paths of MOS transistors whose gates are controlled as a function of the weighting coefficients or by constant potentials.

18. A delay circuit for providing an output signal that has a delay with respect to an input signal, the delay being adjustable as a function of a delay instruction, said delay circuit comprising:
a primary circuit that receives the input signal and outputs first and second intermediate signals, there being a fixed delay between the first and second intermediate signals;
a combination circuit that receives the first and second intermediate signals and outputs a combination signal; and
a shaping circuit that receives the combination signal and outputs the output signal based on a threshold level,
wherein the primary circuit includes a plurality of serially-connected buffer memories that delay the input signal, and first and second multiplexers coupled to the input signal and the outputs of the buffer memories, the first and second multiplexers outputting the first and second intermediate signals, and
the combination circuit includes:
a control input that receives a control variable representing the delay instruction;
a capacitor connected between a common line and a first supply potential; and
first and second circuit modules that charge and discharge the capacitor through the common line, the first circuit module being controlled by the first intermediate signal and the second circuit module being controlled by the second intermediate signal, the common line providing the combination signal,
wherein each of the circuit modules includes a charging circuit and a discharging circuit, each of the discharging circuits having a switch for selectively coupling the common line to the first supply potential through one variable resistor and one non-variable resistor that are connected in parallel, wherein the non-variable resistor is independent of the control variable received on the control input and the non-variable resistor causes each of the first and the second circuit modules to contribute current so as to form the output signal which is linear over a time period provided by the delay instruction, each of the charging circuits having a switch for selectively coupling the common line to a second supply potential through one variable resistor and one non-variable resistor that are connected in parallel, the switches of the charging and discharging circuits being controlled by the first and second intermediate signals from the primary circuit.

19. The delay circuit as defined in claim 18,
wherein the input signal and an output of the second buffer memory are supplied to the first multiplexer, and an output of the first buffer memory and an output of the third buffer memory are supplied to the second multiplexer.

20. The delay circuit as defined in claim 18, wherein each circuit module includes at least two branches that are controlled by weighting signals and another branch that is permanently conductive.

* * * * *